(12) United States Patent
Blumke et al.

(10) Patent No.: US 8,878,575 B1
(45) Date of Patent: Nov. 4, 2014

(54) NOISE REDUCTION FOR NON-LINEAR TRANSMISSION LINE (NLTL) FREQUENCY MULTIPLIER

(71) Applicant: Raytheon Company, Waltham, MA (US)

(72) Inventors: Joel Charles Blumke, Tucson, AZ (US); Ray Soloman Skaggs, Sahuarita, AZ (US); Lawrence Wayne Tiffin, Vail, AZ (US); Christian Maldonado-Echevarria, Vail, AZ (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 13/927,706

(22) Filed: Jun. 26, 2013

(51) Int. Cl.
*H03B 19/00* (2006.01)
*H03B 19/18* (2006.01)

(52) U.S. Cl.
CPC .................................. *H03B 19/18* (2013.01)
USPC ............................ 327/119; 327/116; 327/551

(58) Field of Classification Search
CPC ........ H03B 19/00; H03B 19/03; H03B 19/05; H03B 19/06; H03B 19/08; H03B 19/10; H03B 19/14; H03B 19/16; H03B 19/18; H03B 19/20
USPC ............... 327/116, 119–122, 551; 377/47, 48
See application file for complete search history.

(56) References Cited

U.S. PATENT DOCUMENTS

| 6,125,271 | A  | * | 9/2000 | Rowland, Jr. | 455/313 |
| 6,690,247 | B2 | * | 2/2004 | Kintis et al. | 333/20 |
| 7,462,956 | B2 |   | 12/2008 | Lan et al. | |
| 7,612,629 | B2 |   | 11/2009 | Pepper | |
| 8,283,932 | B2 | * | 10/2012 | Yu | 324/613 |

OTHER PUBLICATIONS

Rodwell et al., "GaAs Nonlinear Transmission Lines for Picosecond Pulse Generation and Millimeter-Wave Sampling," IEEE Transactions on Microwave Theory and Techniques, vol. 39, No. 1, Jul. 1991, pp. 1192-1203.
Tang et al.,"Low Spurious, Broadband Frequency Translator Using Left-Handed Nonlinear Transmission Line," IEEE Microwave and Wireless Components Letters, vol. 19, No. 4, Apr. 2009, pp. 221-223.
A New Breed of Comb Generators Featuring Low Phase Noise and Low Input Power, Microwave Journal. May 2006.

* cited by examiner

*Primary Examiner* — William Hernandez
(74) *Attorney, Agent, or Firm* — Eric A. Gifford

(57) ABSTRACT

A noise reduction filter is inserted between the source and non-linear transmission line (NLTL) in a frequency multiplier to improve phase noise performance. The noise reduction filter is suitably coupled directly to the input of the NLTL. The noise reduction filter and the output BPF are suitably low complexity filters.

18 Claims, 8 Drawing Sheets

NOISE REDUCTION FOR NON-LINEAR TRANSMISSION LINE (NLTL) FREQUENCY MULTIPLIER

BACKGROUND OF THE INVENTION

1. Field of the Invention

This invention relates to Non-Linear Transmission Line (NLTL) Frequency Multipliers, and more particularly to noise reduction for NLTL Frequency Multipliers.

2. Description of the Related Art

Microwave systems often require high frequency input signals. Frequency multipliers are used to translate a low frequency input signal to a desired higher frequency. Frequency multipliers include a source of the low frequency input signal, a comb generator that produces output signals at multiple harmonics of the input signal, a band pass filter (BPF) that selects one of the harmonics and amplifier.

Conventional comb generators produce the harmonics using step recovery diodes (SRD). SRD implementations generally accept input signals over a narrow range of frequencies and power levels, thereby limiting user selection of harmonics spacing and frequency range. In addition, SRD implementations can introduce substantial phase noise.

A new family of comb generators based on nonlinear transmission line (NLTL) technology has demonstrated improved phase noise and a wider input power range. NLTL generators create output harmonics through the nonlinear nature of propagation within the device, avoiding exposure to recombination and shot noise that is prevalent within step recovery diodes. The aggregate effect of this new technology is that the residual phase noise is dramatically better—NLTL comb generators are exhibiting at least a 20 dB improvement over their SRD counterparts.

Referring now to FIG. 1, a nonlinear transmission line (NLTL) 10 is a transmission line formed from a periodic structure of series inductors 12 and variable shunt capacitors 14. The variable shunt capacitors are suitably voltage sensitive Schottky varactor diodes. The capacitance of a reverse biased Schottky diode is voltage dependent such that the capacitance at low reverse bias is much greater than the capacitance at high reverse bias. An input signal 16 propagating on the equivalent transmission line made with varactors experiences a propagation velocity that is voltage dependent. A signal that transitions from low to high voltage will be compressed in time as the initial low voltage portion of the signal travels down the line slower than the later, higher voltage portion of the signal. Consequently, the higher voltage portion of the waveform "catches up" with the lower voltage portion of the step, resulting in increasing the edge speed of the low to-high transition. This sharper rising edge waveform produces an output signal 18 that is rich in signal harmonics in the frequency spectrum. A more complete description of a NLTL is provided in Mark J. Rodwell et al. "GaAs Nonlinear Transmission Lines for Picosecond Pulse Generation and Millimeter-Wave Sampling" IEEE Transactions on Microwave Theory and Techniques, Vol. 39, No. 7, July 1991, pp. 1194-1204 and Wenjia Tang et al. "Low Spurious, Broadband Frequency Translator using Left-Handed Nonlinear Transmission Line" IEEE Microwave and Wireless Components letters, Vol. 19. No. 4, April 2009, pp. 221-223, which are hereby incorporated by reference.

Referring now to FIGS. 2 and 3, a frequency multiplier 20 includes a source 22 that supplies an input signal 24 (frequency-domain representation 26) at a frequency $F_o$, a NLTL 27 that propagates the input signal nonlinearly to produce a sharp rising edge waveform 28 with multiple harmonics 30 of the input signal in the frequency domain, a band pass filter (BPF) 32 that selects one of the harmonics 33 ($NF_0$) as an output signal 34 and an amplifier 35 that amplifies the output signal 34. A more complete description of a frequency multiplier using NLTL technology is provided in U.S. Pat. Nos. 7,462,956 and 7,612,629, which are hereby incorporated by reference.

Source 22 typically includes an oscillator 36 that generates input signal 24 at a given frequency $F_0$. The amplitude level of input signal 24 must match the input range of the NLTL. Typical sources generate the input signal 24 at a fixed amplitude that does not match the NLTL. Typically, the input signal needs to be amplified. In an embodiment, source 22 includes an amplifier 37 that provides a fixed amount of gain, an input attenuator 38 that attenuates input signal 24 so that its amplitude lies in the linear region of amplifier 37 and an output attenuator 40 that attenuates the amplified signal to provide level adjustment to match the input range of the NLTL. Other source configurations are possible.

BPF 32 has a pass band 42 that is approximately centered at the desired harmonic $NF_0$ and sufficiently wide to pass harmonic 33 and side bands 44 that provide sufficient attenuation to reject all other harmonics. Typically, the side bands 44 must satisfy a specified side band rejection requirement 46 (e.g. −40 dB attenuation) at the adjacent harmonics. Filter "Q" determines the width of the pass band 42 and how sharp side bands 44 transition from the pass band level to a high attenuation level. A high Q filter transitions quickly and a low Q filter rolls off slowly. A high Q filter can provide greater side band rejection but is more complex (i.e. a higher order filter), hence costly. Generally speaking, a circuit designer would prefer to select the lowest Q filter that satisfies the side band rejection requirement.

SUMMARY OF THE INVENTION

The following is a summary of the invention in order to provide a basic understanding of some aspects of the invention. This summary is not intended to identify key or critical elements of the invention or to delineate the scope of the invention. Its sole purpose is to present some concepts of the invention in a simplified form as a prelude to the more detailed description and the defining claims that are presented later.

The present invention provides a frequency multiplier based on NLTL technology with reduced phase noise.

In an embodiment, a frequency multiplier comprises a source configured to generate an input electrical signal at an input frequency and amplitude. A noise reduction filter is configured with a pass band to pass the electrical signal at the input frequency and a rejection band to reject a band of low frequencies below the input frequency. A non-linear transmission line (NLTL) is configured to time delay the electrical signal as a function of amplitude to generate electrical signals at integer multiples of the input frequency $F_0$. A band pass filter (BPF) is configured with a pass band to pass one of electrical signals at a particular integer multiple N of the input frequency $F_0$ as a frequency-multiplied electrical signal and side bands to reject all other multiples of the input frequency. An amplifier is configured to amplify the frequency-multiplied electrical signal. Incorporation of the noise reduction filter reduces phase noise in both the main lobe of the frequency-multiplied electrical signal and a side lobe.

In an embodiment, the NLTL is directly coupled to the output of the noise reduction filter. There is no intervening electrical component between the noise reduction filter and the NLTL.

In an embodiment, the noise reduction filter is either a HPF or a BPF.

In an embodiment, the noise reduction filter is at most a $5^{th}$ order filter and the BPF is at most a $7^{th}$ order filter.

In an embodiment, a cut-off frequency Fc that separates the pass band and the rejection band of the noise reduction filter lies below the input frequency offset by half the bandwidth of the input electrical signal. The rejection band provides at least 10 dB of rejection at a frequency Ft where 1/f noise equals the wide band noise floor. The width of the BPF's pass band is between 2 to 5 percent of the selected harmonic $NF_0$.

These and other features and advantages of the invention will be apparent to those skilled in the art from the following detailed description of preferred embodiments, taken together with the accompanying drawings, in which:

DETAILED DESCRIPTION OF THE INVENTION

The present invention describes a frequency multiplier based on NLTL technology with reduced phase noise.

Single-sideband phase noise is the phase instability of the local oscillator (e.g. frequency multiplier) measured in the frequency domain. It is the most commonly used measurement of phase noise. The single side band noise is defined as the ratio of the carrier power to the noise power in a 1 Hz bandwidth, expressed in dBc/Hz, at the given frequency offset, $\Delta f$, from the carrier (e.g. the input signal at $F_0$ or the selected harmonic $NF_0$). In general, phase noise falls off exponentially with frequency offset. Thermal noise caused by random collisions of charge carriers with atoms of the lattice found in metal conductors and resistive materials is the primary source of phase noise in microwave circuits. The oscillator, attenuators and amplifier all contribute to thermal noise. A spectrum analyzer can be used to measure phase noise if the oscillator has no amplitude noise modulation and the phase noise of the spectrum analyzer's oscillators is less than the measured oscillator. Measurement of phase noise near the carrier frequency (<100 Hz offset) is time consuming and very difficult, hence typically not done. Similarly, measurement of phase noise at large offsets (>10 MHz offset) from the carrier requires expensive spectrum analyzers, and is typically not done.

Single-sideband phase noise is important to a local oscillator (e.g. a frequency multiplied source) for a microwave exciter/receiver. Phase noise affects receiver selectivity in a multi-signal environment. Multiplication (or mixing) in the time domain is equivalent to convolution in the frequency domain. Therefore phase noise of one signal will be superimposed upon the other signal during the frequency conversion. Of most interest is the local oscillator phase noise mixing onto the incoming signal of interest. Consequently, phase noise considerations play a major role in the selection of components and circuit architecture.

Figure 1:
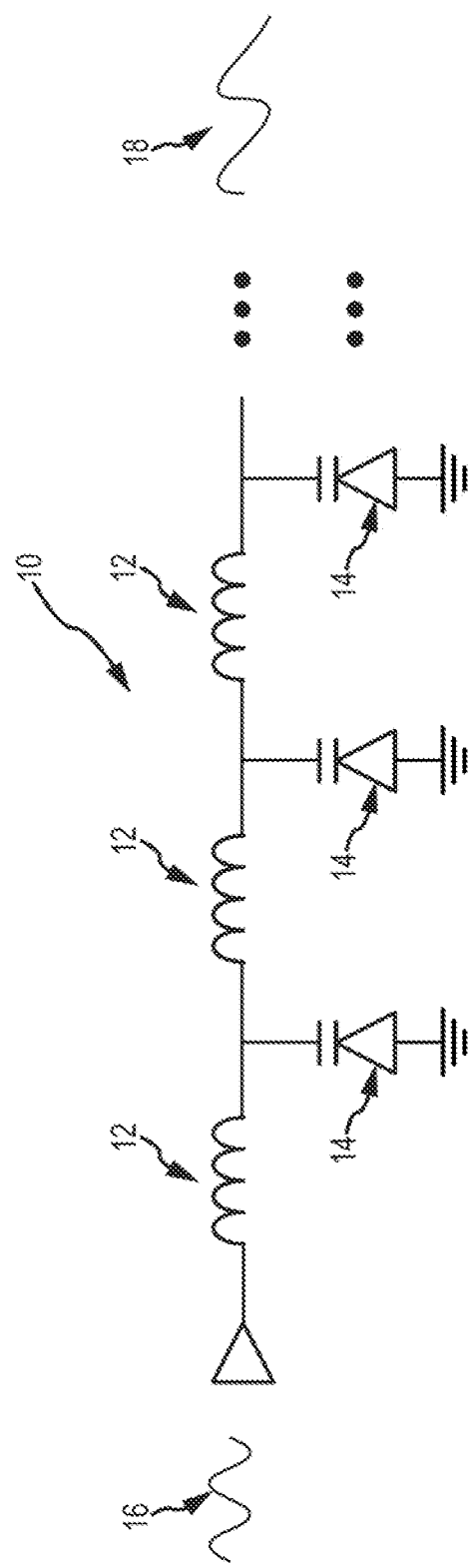
FIG. 1, as described above, is an equivalent circuit of a NLTL.
Figure 2:
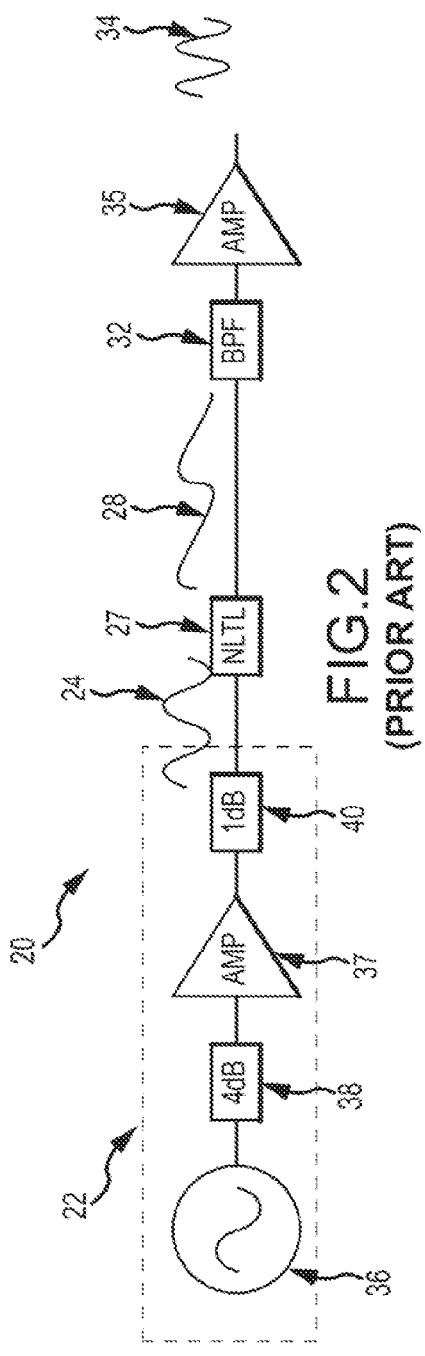
FIG. 2, as described above, is a schematic of a NLTL frequency multiplier.
Figure 3:
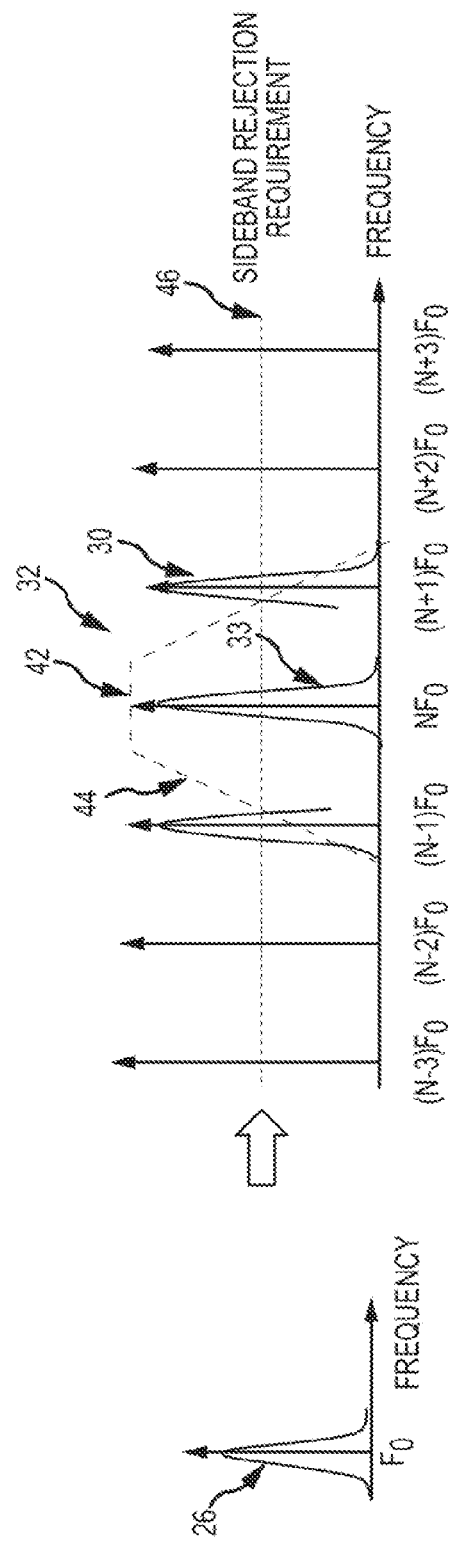
FIG. 3, as described above, is a diagram illustrating the manipulation of an input signal by the NLTL to create multiple harmonics and the selection of the frequency multiplied signal by the BPF.
Figure 4:
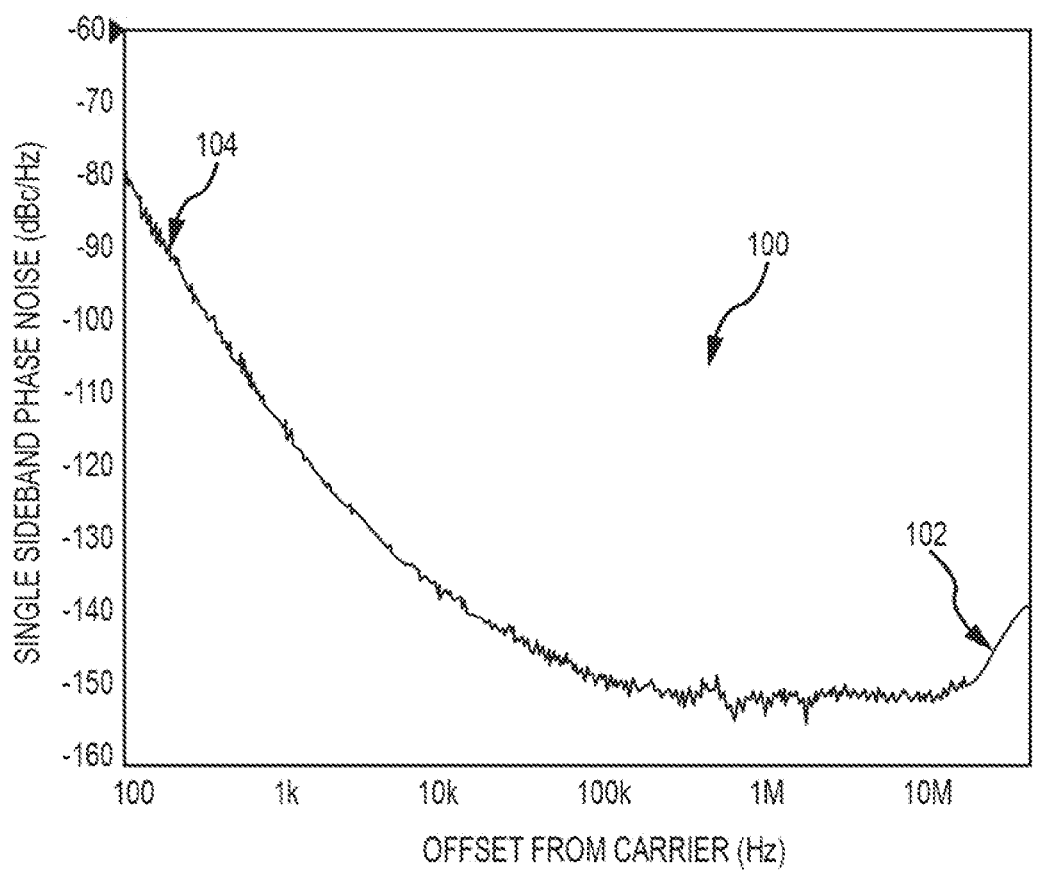
FIG. 4 is a plot of the single sideband phase noise of the frequency multiplied output signal.

FIG. 4 is a plot of the single sideband phase noise 100 for a conventional frequency multiplier based on NLTL technology as illustrated in FIGS. 1-3 above in which the harmonics are separated by about 500 MHz. Our interest is directed to local oscillators such as provided by the frequency multiplier with very stringent phase noise requirements for microwave exciters/receivers. We measured the phase noise of the frequency multiplier circuit from approximately 100 Hz out to an offset of approximately 100 MHz. This test revealed a "side lobe" 102 between approximately 40 MHz and 100 MHz in which the phase noise unexpectedly and markedly increased. Although not directly apparent from this plot of phase noise, the main lobe 104 of the selected harmonic included an additional phase noise component as well, approximately 10 dB at 100 Hz. This was only discovered after we inserted a noise reduction filter before the NLTL to reduce side lobe 102.

Although the source of the phase noise that creates the side lobe 102 and adds to the phase noise of the main lobe 104 is unknown, we hypothesize that it is caused by a nonlinear interaction of the NLTL with 1/f noise that is present in all electrical components. The exact origins of 1/f noise are unknown. However, 1/f noise is a time dependent noise term that is a function of how long something is observed. The closer the observation is to the carrier the longer the observation time, hence the larger the phase fluctuations.

Figure 5A:
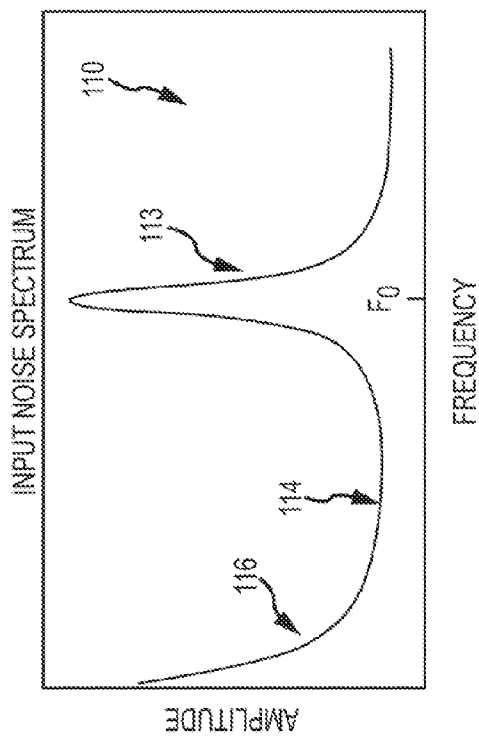
FIGS. 5a and 5b are plots of input and output noise spectra for the frequency multiplier.
Figure 5B:
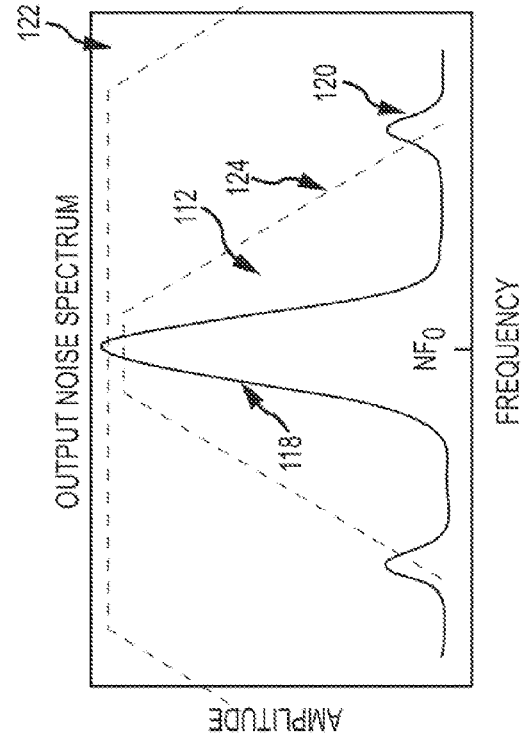

Referring now to the figures, FIG. 5a depicts a hypothesized input noise spectrum 110 whose interaction with the NLTL may produce the observed output noise spectrum 112 shown in FIG. 5b as double-sided phase noise about the carrier frequency $NF_0$. As hypothesized, input noise spectrum 110 includes the phase noise 113 of the source (e.g. oscillator, attenuators and amplifier) about the input frequency, a wideband noise floor 114 that is set by thermal noise as well and a 1/f noise component 116. 1/f noise is a low frequency noise that would not be expected to impact the phase noise of the output carrier frequency (e.g. selected harmonic $NF_0$) at the output of the NLTL. However, our hypothesis is that somehow the 1/f noise is interacting with the NLTL to superimpose a significant measure of phase noise on the main lobe 118 and create a side lobe 120 in the observed output noise spectrum 112.

The frequency response 122 of a standard low-Q BPF (no greater than $7^{th}$ order) used in frequency multipliers is overlaid on the output noise spectrum 112. The width of the pass band is such that the side lobes 120 are not attenuated. A typical width of the pass band being 2-5% of the output carrier signal frequency. As a result, the phase noise in the side lobes contributes to the overall phase noise of the output carrier signal and local oscillator. Furthermore, the BPF cannot remove the phase noise component that has been added to the main lobe at the carrier signal. One approach to reducing the phase noise would be to use a high-Q BPF having a frequency response 124. The illustrated frequency response would require a $5^{th}$ order or higher BPF with a pass band bandwidth of a fraction of 1%. The high-Q BPF would attenuate the side lobe contributions but could not remove the main lobe component. Furthermore, designers typically wish to avoid the additional complexity and cost of high-Q BPFs.

Figure 6:
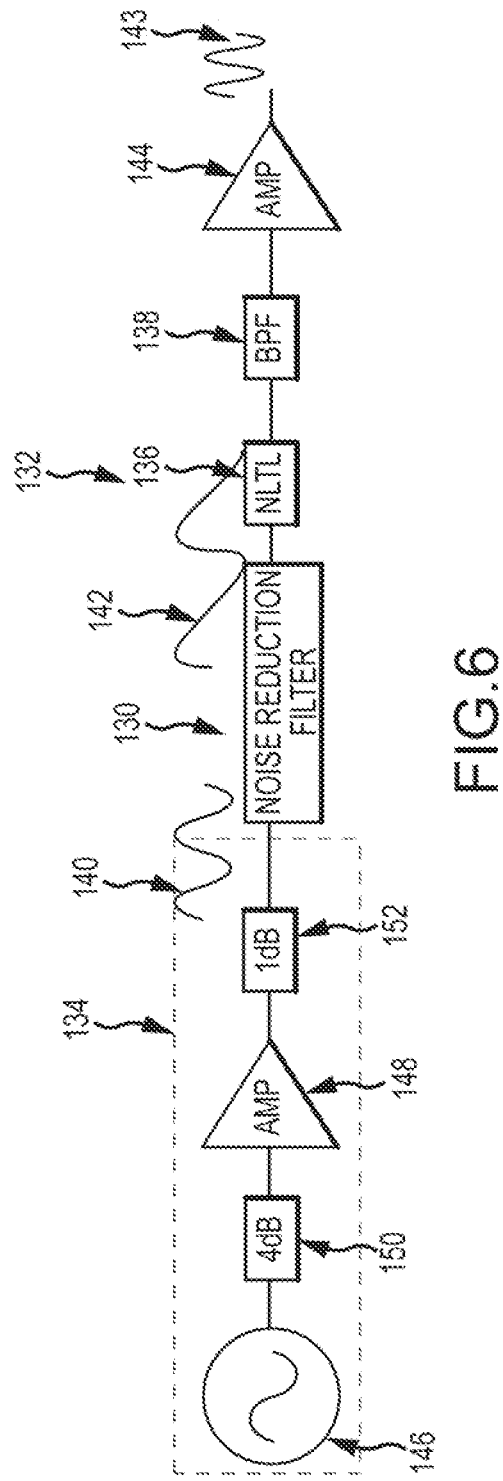
FIG. 6 is an embodiment of a noise-reduced NLTL frequency multiplier.
Figure 7:
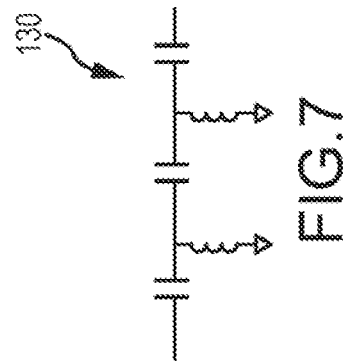
FIG. 7 is a schematic of a High Pass Filter (HPF)

Referring now to FIG. 6, in accordance with an embodiment of the invention a noise reduction filter 130 is added to a frequency multiplier 132 between source 134 and NLTL 136. Noise reduction filter 130 is configured to pass the input signal frequency and reject low frequency 1/f noise. Noise reduction filter 130 may be a high pass filter (HPF) or another BPF. Measurements of the single side phase noise have shown that the noise reduction filter 130 attenuates both the side lobe and main lobe phase noise components. The noise reduction filter 130 provides better performance than even the high-Q BPF at the output, and the total complexity and cost of a low-order noise reduction filter 130 and a low-order BPF 138 is less than a single high-order BPF at the output. FIG. 7 is a schematic diagram of an embodiment of noise reduction filter 130 configured as a $5^{th}$ order high pass filter (HPF).

Frequency multiplier 132 includes source 134 that supplies an input signal 140 at a frequency $F_0$, noise reduction filter 130 that passes the input signal 140 while rejecting lower frequencies, NLTL 136 that propagates the input signal non-linearly to produce a sharp rising edge waveform 142 with multiple harmonics of the input signal in the frequency domain, BPF 138 that selects one of the harmonics ($NF_0$) as an output carrier signal 143 and an amplifier 144 that amplifies the output carrier signal 143.

Source 134 typically includes an oscillator 146 that generates input signal 140 at a given frequency $F_0$. The amplitude level of input signal 140 must match the input range of the NLTL. Typical sources generate the input signal 140 at a fixed amplitude that does not match the NLTL. Typically, the input signal needs to be amplified. In an embodiment, source 134 includes an amplifier 148 that provides a fixed amount of gain, an input attenuator 150 that attenuates input signal 140 so that its amplitude lies in the linear region of amplifier 148 and an output attenuator 152 that attenuates the amplified signal to provide level adjustment to match the input range of the NLTL. Other source configurations are possible.

The output band pass filter 138 is designed to reject the adjacent comb sidebands to the required level for the given application with the widest possible pass band bandwidth (allowing for component and temperature variations) and keeping the filter order as low as possible for lowest size and cost. Typical filter bandwidths range in the 2%-5% with filter orders being at most 7 and typically in the $5^{th}$ order range.

In order to maintain the amplitude of the selected harmonic, an absorptive band pass filter 138 is employed at the output of the comb generator to absorb rather than reflect input signal harmonics that can destructively cancel the required output signal. In a typical band pass filter, out of band signals are reflected back to the source due to a 0 dB return loss characteristic. These reflected signals can be out of phase and sub harmonically related with the output signal. The combined in phase and out of phase signals cancel each other and drastically lower the output signal amplitude. The same effect may be achieved with a reflective BPF 138 if the order of the Harmonic is a prime number, or possibly just an odd number. In this case, the combined in phase and out of phase signals will not cancel each other.

Figure 8:
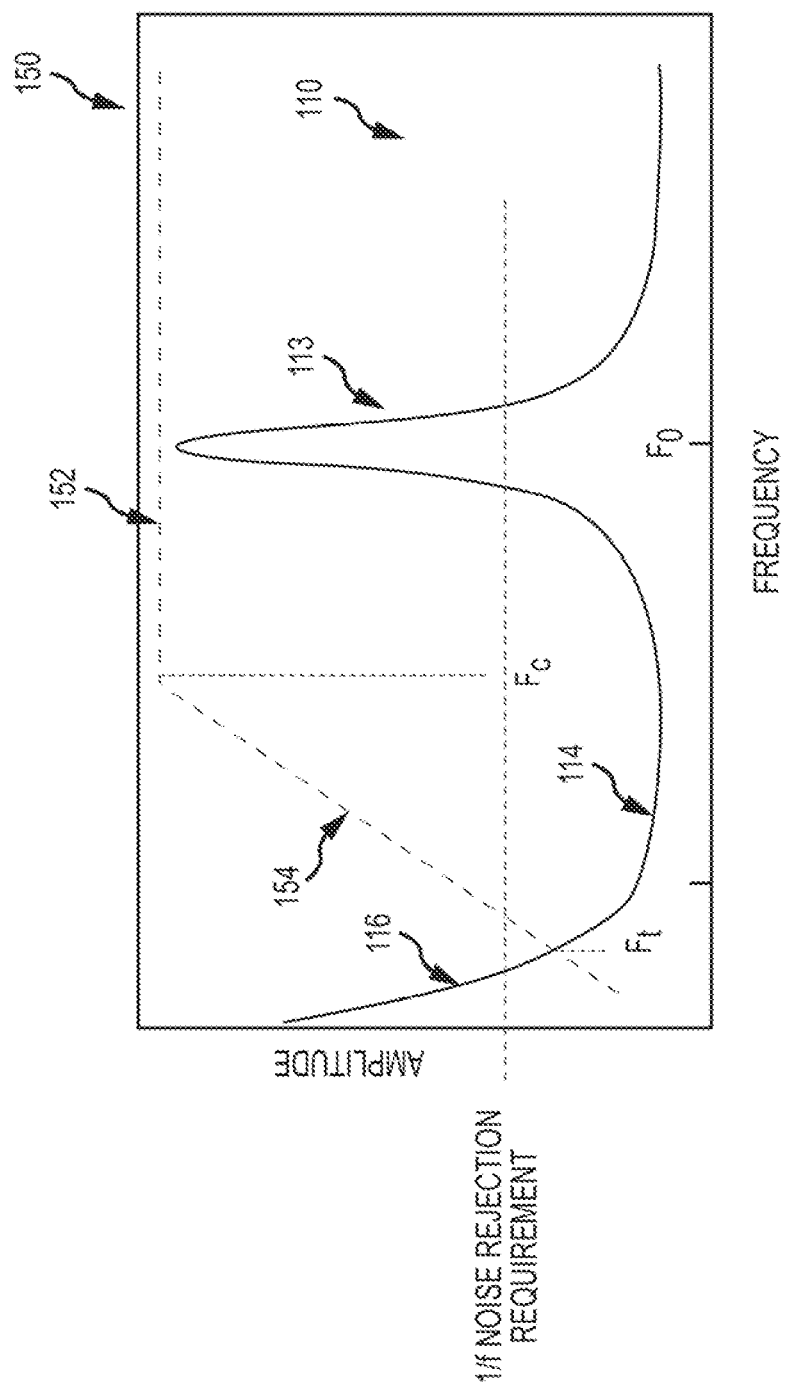
FIG. 8 is a drawing of the HPF response overlaid on the input noise spectrum.

As shown in FIG. 8, the frequency response 150 of a HPF (the noise rejection filter 130) is overlaid on the input noise spectrum 110. Frequency response 150 includes a pass band 152 and a rejection band 154 that are separated by a cutoff frequency Fc. A frequency Ft is defined as the frequency at which the 1/f noise 116 equals the wide bandnoise floor 114. Rejection band 154 provides sufficient attenuation to satisfy a 1/f noise rejection requirement (e.g. at least 10 dB) at a frequency Ft where 1/f noise equals the wide band noise floor.

Cutoff frequency Fc must be chosen to pass the required frequency content 113 of the input signal 112 while rejecting the low frequency 1/f noise 116. Regardless of the filter insertion loss, wanted signals must be above Fc while unwanted signals must fall below Fc. Inherent component and temperature variations will cause an uncertainty in the absolute value of Fc. If a cutoff frequency is chosen too close to the input signal frequency $F_0$, filter component variations can cause the HPF stop band frequency to fall on the input frequency and attenuate the input signal. If the cutoff frequency Fc is chosen too close to the 1/f noise spectrum, than a higher order filter (more components) will need to be used to reject the low frequency 1/f noise. In most applications, there is a large range of HPF cutoff frequencies that can be chosen to pass the input signal while attenuating the low frequency 1/f noise while keeping the filter order low (minimum parts count) and accounting for known component variations.

Figure 9:
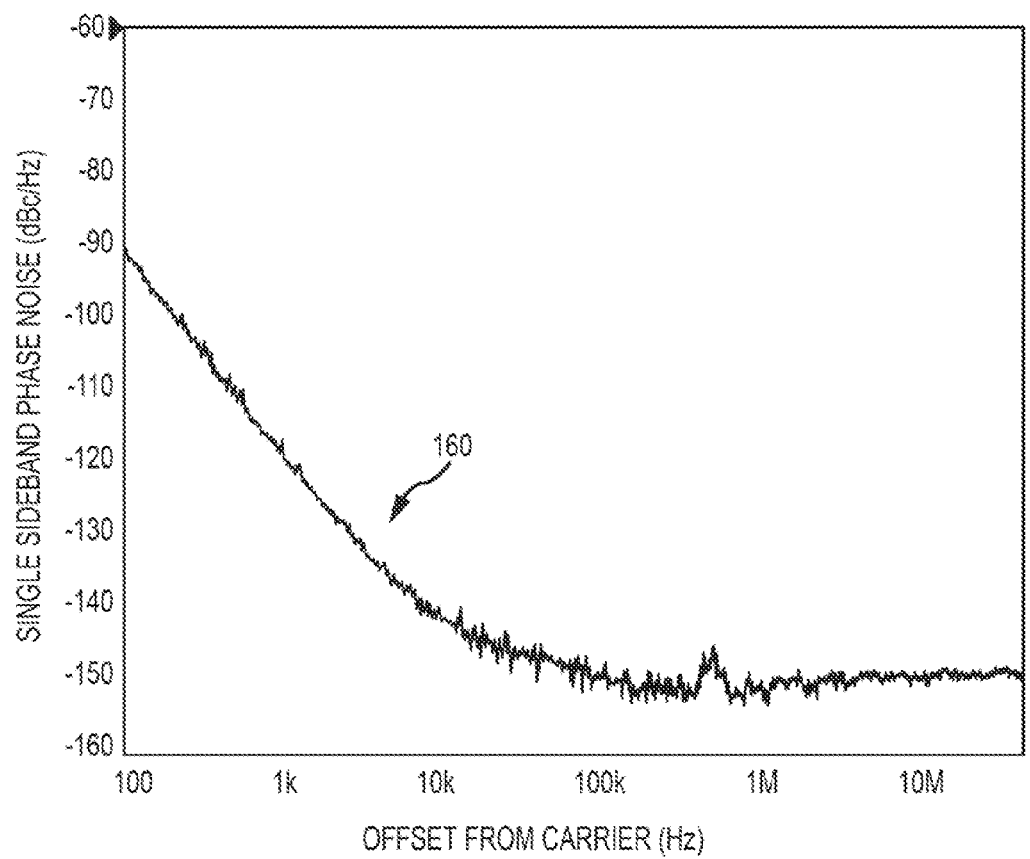
FIG. 9 is a plot of the noise spectrum of the noise-reduced frequency multiplied output signal.

FIG. 9 is a plot of the single sideband phase noise 160 for a noise reduced frequency multiplier based on NLTL technology of the type shown in FIG. 6. The insertion of a noise reduction filter in the frequency multiplier immediately prior to the NLTL eliminated the side lobe between 40 and 100 MHz and reduced the phase noise at 100 Hz by approximately 10 dB, this being a clear indicator of reduced phase noise in the main lobe. This was achieved with a $5^{th}$ order HPF implementation of the noise reduction filter and a $5^{th}$ order implementation of the absorptive BPF.

Figure 10:
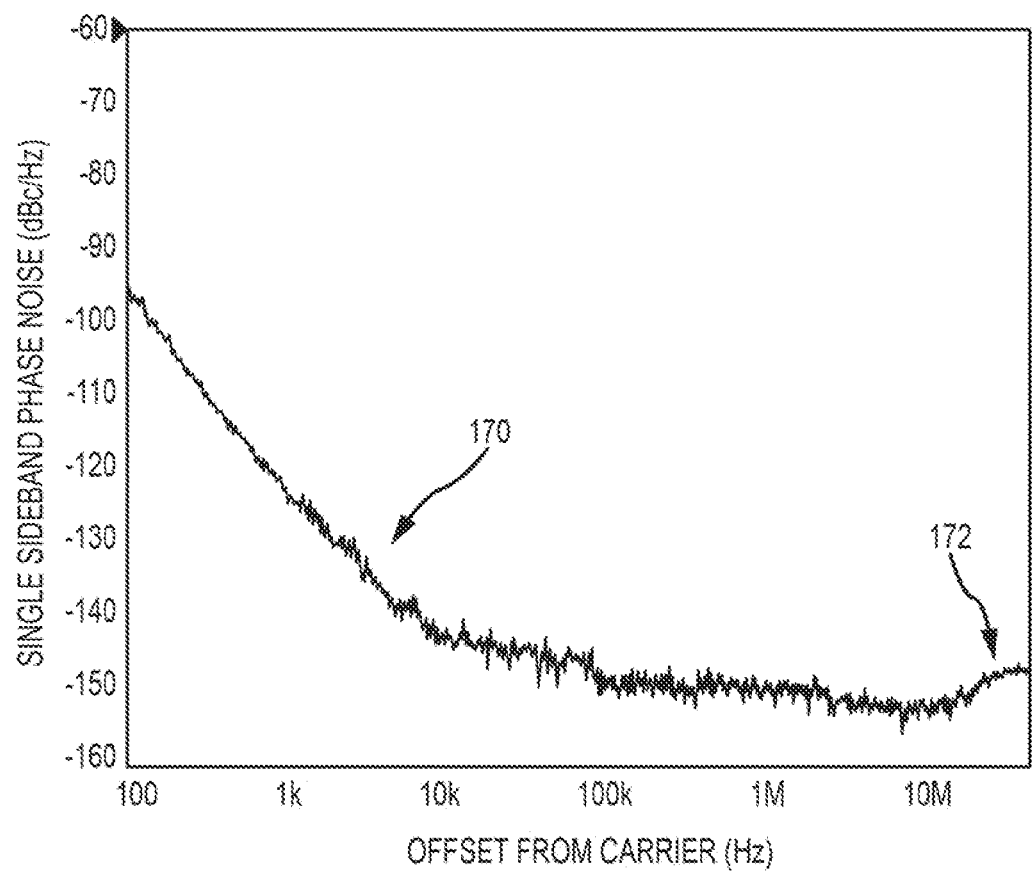
FIG. 10 is a plot of the noise spectrum of a noise-reduced frequency multiplied output signal in which the HPF and NLTL are separated by an attenuator.

FIG. 10 is a plot of the single sideband phase noise 170 for a noise reduced frequency multiplier based on NLTL technology of the type shown in FIG. 6. However, in this example, an attenuator was placed between the noise reduction filter and the NLTL. The result was the reemergence of a "side lobe' 172 at about 20 MHz. This shows the importance of directly coupling the NLTL to the output of the noise reduction filter.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

We claim:

1. A frequency multiplier, comprising:
   a source configured to generate an input electrical signal at an input frequency $F_0$ and amplitude;
   a noise reduction filter (NRF) configured with a pass band to pass the input electrical signal at the input frequency and a rejection band to reject a band of low frequency 1/f noise below the input frequency where f is frequency, said NRF's rejection band configured to provide at least 10 dB of rejection where the 1/f noise equals a wide band noise floor;
   a non-linear transmission line (NLTL) configured to time delay the input electrical signal as a function of amplitude to generate a plurality of electrical signals at integer multiples of the input frequency, wherein said NRF reduces phase noise in both a main lobe and a side lobe of each said frequency-multiplied electrical signal;
   a band pass filter (BPF) configured with a pass band to pass the main lobe of one of the plurality of electrical signals at a particular integer multiple N of the input frequency as a frequency-multiplied electrical signal and side bands to reject the side lobe of the passed electrical signal and the main and side lobes of all other multiples of the input frequency, wherein the width of the pass band is at least 2 percent of $N*F_0$; and an amplifier configured to amplify the frequency-multiplied electrical signal.

2. The frequency multiplier of claim 1, wherein an input of the NLTL is directly coupled to an output of the noise reduction filter.

3. The frequency multiplier of claim 1, wherein the noise reduction filter is at most a $5^{th}$ order filter.

4. The frequency multiplier of claim 3, wherein the noise reduction filter is a high pass filter.

5. The frequency multiplier of claim 3, wherein the BPF is at most a $7^{th}$ order filter.

6. The frequency multiplier of claim 1, wherein said noise reduction filter has a cut-off frequency Fc that separates the pass band and the rejection band that lies below the input frequency offset by half the bandwidth of the input electrical signal.

7. The frequency multiplier of claim 1, wherein the pass band of the BPF is between 2 to 5 percent of $N*F_0$.

8. The frequency multiplier of claim 1, wherein the source comprises an oscillator that generates the input electrical signal, an amplifier having a linear input range, a first attenuator that matches the amplitude of the input electrical signal to the linear input range of the amplifier, and a second attenuator that level shifts the amplified input electrical signal to an input range of the NLTL.

9. The frequency multiplier of claim 1, wherein the NLTL comprises a periodic structure of series inductors and variable shunt capacitors.

10. The frequency multiplier of claim 1, wherein the BPF is an absorptive BPF.

11. The frequency multiplier of claim 1, wherein the Harmonic of the BPF is odd.

12. A frequency multiplier, comprising:
a source configured to generate an input electrical signal at an input frequency $F_0$ and amplitude;
a noise reduction filter (NRF) configured with a pass band to pass the input electrical signal at the input frequency and a rejection band to reject a band of low frequency 1/f noise below the input frequency where f is frequency, wherein said noise reduction filter is at most a $5^{th}$ order filter; and
a non-linear transmission line (NLTL) coupled directly to the NRF, said NLTL configured to time delay the input electrical signal as a function of amplitude to generate a plurality of electrical signals at integer multiples of the input frequency, wherein said NRF reduces phase noise in both a main lobe and a side lobe of each said frequency-multiplied electrical signal;
a band pass filter (BPF) configured with a pass band to pass the main lobe of one of the plurality of electrical signals at a particular integer multiple N of the input frequency as a frequency-multiplied electrical signal and side bands to reject all other multiples of the input frequency, wherein said BPF is at most a $7^{th}$ order filter and the width of it's pass band is at least 2 percent of $N*F_0$; and
an amplifier configured to amplify the frequency-multiplied electrical signal.

13. The frequency multiplier of claim 12, wherein said multiplier is characterized by the 1/f noise and a wide band noise floor, said noise reduction filter having a cut-off frequency Fc that separates the pass band and the rejection band that lies below the input frequency offset by half the bandwidth of the input electrical signal, wherein the filter's rejection band provides at least 10 dB of rejection at a frequency Ft where 1/f noise equals the wide band noise floor.

14. The frequency multiplier of claim 13, wherein the pass band of the BPF is between 2 to 5 percent of $N*F_0$.

15. The frequency multiplier of claim 12, wherein the noise reduction filter is a high pass filter.

16. A frequency multiplier, comprising:
a source configured to generate an input electrical signal at an input frequency $F_0$ and amplitude, wherein said source is characterized by 1/f noise where f is frequency and a wide band noise floor;
a noise reduction filter (NRF) configured with a pass band to pass the input electrical signal at the input frequency and a rejection band to reject a band of low frequency 1/f noise below the input frequency, wherein a cut-off frequency Fc that separates the pass band and the rejection band is below the input frequency offset by half the bandwidth of the input electrical signal and wherein the rejection band provides at least 10 dB of rejection at a frequency Ft where 1/f noise equals the wide band noise floor; and
a non-linear transmission line (NLTL) coupled directly to the NRF, said NLTL configured to time delay the input electrical signal as a function of amplitude to generate a plurality of electrical signals at integer multiples of the input frequency, wherein said NRF reduces phase noise in both a main lobe and a side lobe of each said frequency-multiplied electrical signal;
a band pass filter (BPF) configured with a pass band to pass one of the plurality of electrical signals at a particular integer multiple $NF_0$ of the input frequency as a frequency-multiplied electrical signal and side bands to reject all other multiples of the input frequency, wherein the pass band is between 2 to 5 percent of $NF_0$; and
an amplifier configured to amplify the frequency-multiplied electrical signal.

17. The frequency multiplier of claim 16, wherein the noise reduction filter is at most a $5^{th}$ order filter.

18. The frequency multiplier of claim 17, wherein the BPF is at most a $7^{th}$ order filter.

* * * * *